(12) United States Patent
You et al.

(10) Patent No.: US 11,579,476 B2
(45) Date of Patent: Feb. 14, 2023

(54) DISPLAY DEVICE COMPRISING A DISPLAY PANEL HAVING A LAMBERTIAN LIGHT EMISSION DISTRIBUTION AND A VIEWING ANGLE MODULATOR INCLUDING A DIFFRACTION STRUCTURE

(71) Applicant: Samsung Display Co., LTD., Yongin-si (KR)

(72) Inventors: Jae Ho You, Yongin-si (KR); Jae Joong Kwon, Yongin-si (KR); Beom Shik Kim, Yongin-si (KR); Young Chan Kim, Yongin-si (KR); Hyun Jin Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/463,987

(22) Filed: Sep. 1, 2021

(65) Prior Publication Data

US 2022/0221748 A1     Jul. 14, 2022

(30) Foreign Application Priority Data

Jan. 12, 2021   (KR) .......................... 10-2021-0004283

(51) Int. Cl.
  *G02F 1/13*     (2006.01)
  *G02F 1/1334*   (2006.01)
  *G02F 1/1335*   (2006.01)

(52) U.S. Cl.
  CPC ........ *G02F 1/1323* (2013.01); *G02F 1/13345* (2021.01); *G02F 1/133504* (2013.01)

(58) Field of Classification Search
  CPC ... G02F 1/13345; G02F 2201/305; G02F 1/19
  See application file for complete search history.

(56) References Cited

U.S. PATENT DOCUMENTS

| 8,503,122 | B2 | 8/2013 | Liu et al. | |
|---|---|---|---|---|
| 8,619,363 | B1 | 12/2013 | Coleman | |
| 2020/0004061 | A1* | 1/2020 | Woodgate | G02F 1/137 |
| 2020/0026114 | A1* | 1/2020 | Harrold | G02F 1/13475 |
| 2020/0218101 | A1* | 7/2020 | Ihas | G02B 6/0053 |
| 2020/0257153 | A1* | 8/2020 | Robinson | G02B 5/0221 |

FOREIGN PATENT DOCUMENTS

| KR | 10-1950379 | 2/2019 |
|---|---|---|
| KR | 10-2020-0076677 | 6/2020 |
| WO | 2019/055753 | 3/2019 |

* cited by examiner

*Primary Examiner* — Paul C Lee
(74) *Attorney, Agent, or Firm* — Kile Park Reed & Houtteman PLLC

(57) ABSTRACT

A display device includes a display panel including a display surface having a Lambertian light emission distribution, and a viewing angle modulator disposed on the display panel. The viewing angle modulator includes a first refractive layer including a diffraction structure on a surface, a refractive index conversion layer disposed on the first refractive layer and including an electro-optical material having a refractive index that changes when a voltage is applied to the electro-optical material, and a second refractive layer disposed on the refractive index conversion layer. The refractive index conversion layer includes a base layer, and an optical structure disposed on the base layer that changes a path of light incident on a surface facing the second refractive layer.

20 Claims, 11 Drawing Sheets

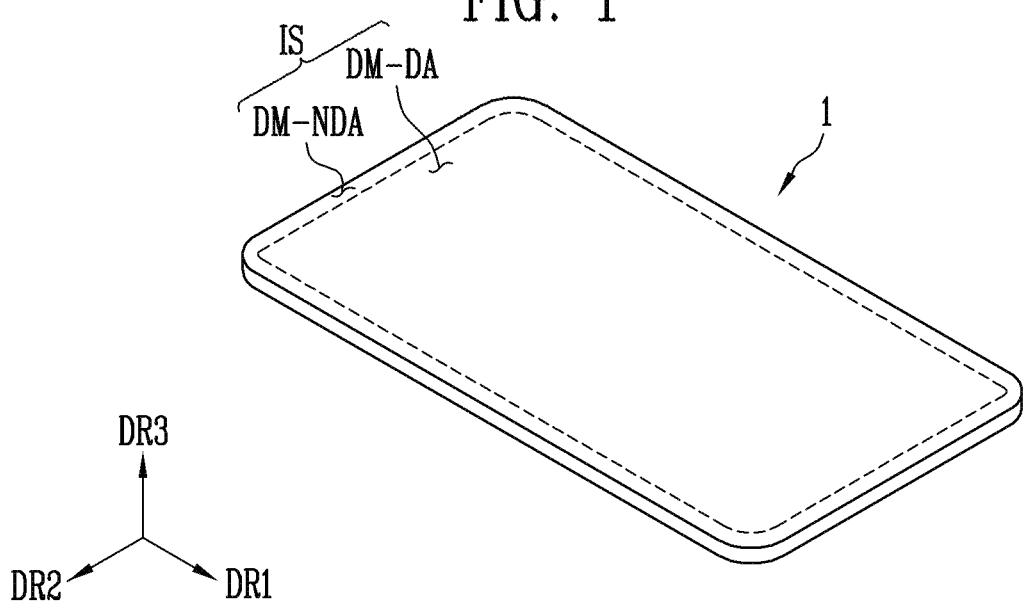
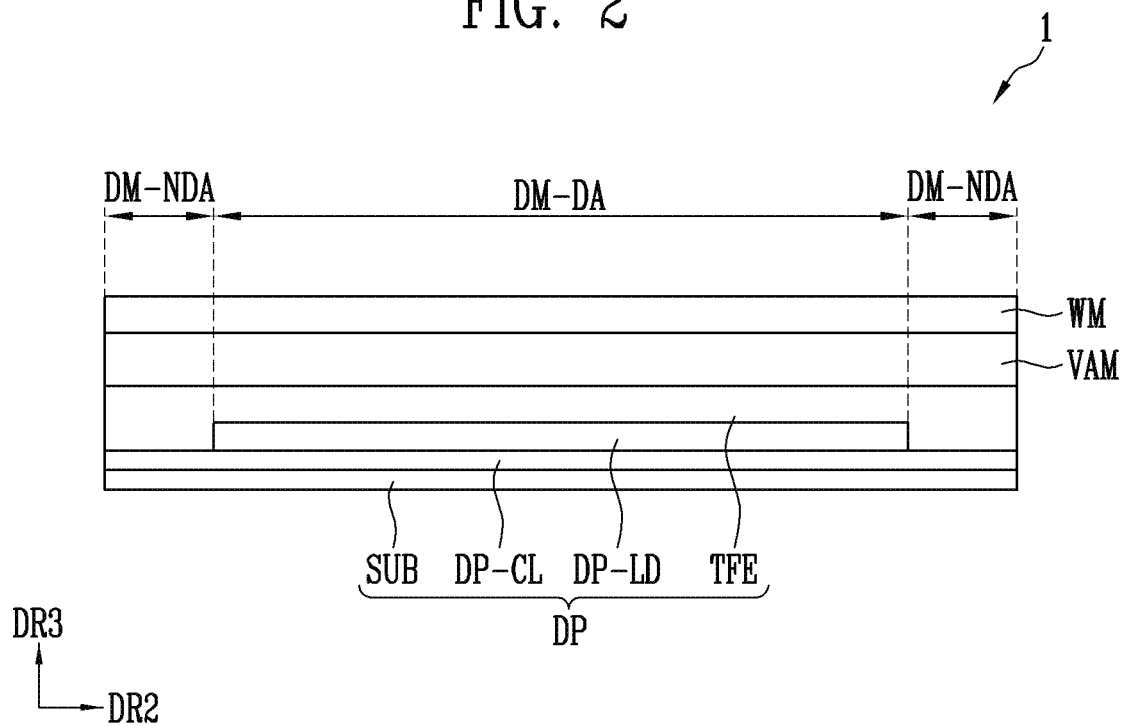

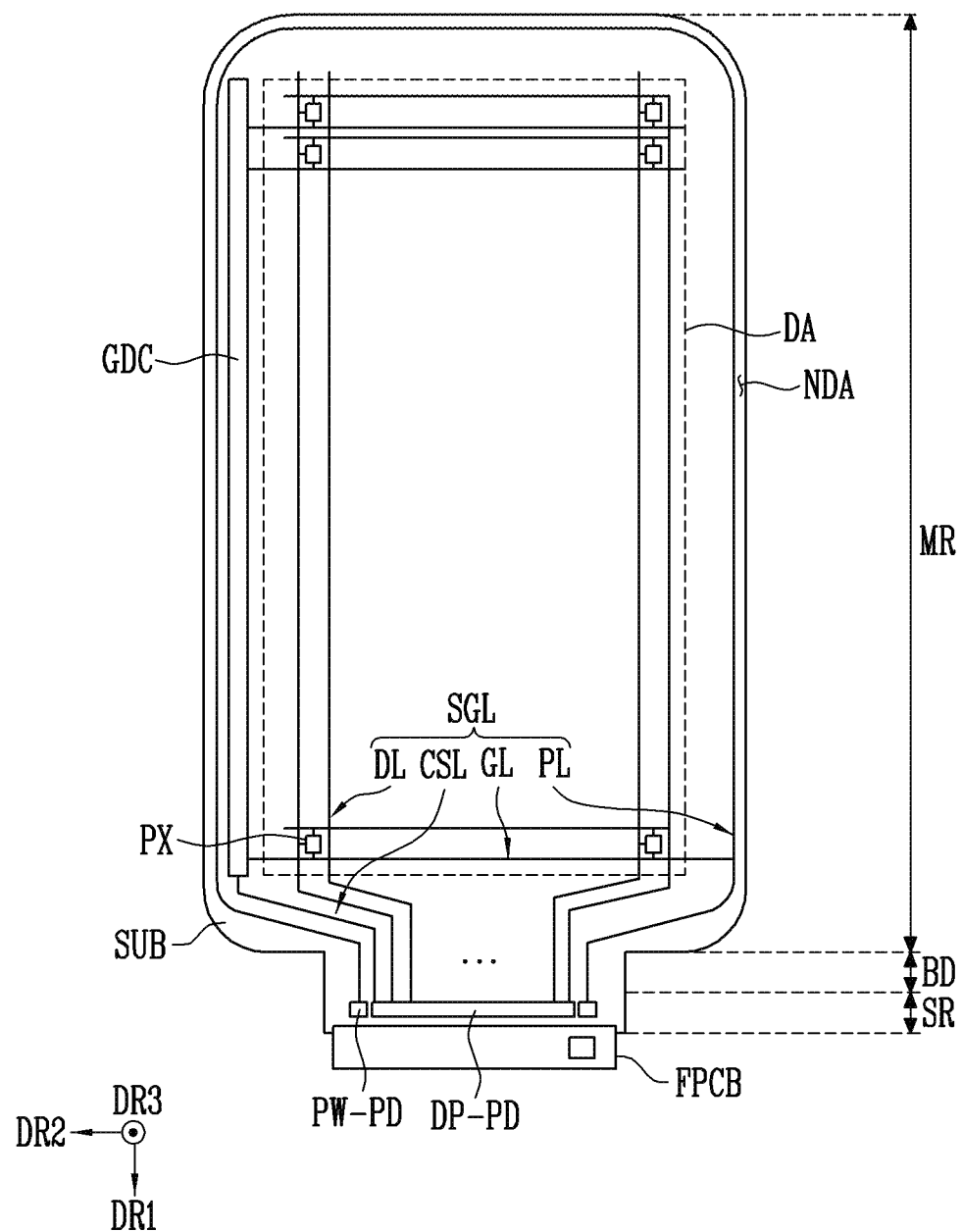

DISPLAY DEVICE COMPRISING A DISPLAY PANEL HAVING A LAMBERTIAN LIGHT EMISSION DISTRIBUTION AND A VIEWING ANGLE MODULATOR INCLUDING A DIFFRACTION STRUCTURE

CROSS-REFERENCE TO RELATED APPLICATION(S)

This application claims priority to and benefits of Korean Patent Application No. 10-2021-0004283 under 35 U.S.C. § 119, filed Jan. 12, 2021 in the Korean Intellectual Property Office, the entire contents of which are incorporated herein by reference.

BACKGROUND

1. Technical Field

The disclosure relates to a display device.

2. Description of the Related Art

A display device is a device that displays an image and may include a display panel such as an organic light emitting display panel including an organic light emitting diode (OLED) element or a quantum dot electroluminescence (QD-EL) element, or a liquid crystal display panel.

In case that several users use a display device at the same time, or in case that one user uses a display device at an oblique angle instead of the front, it is desirable for the display device to have a wide viewing angle to improve visibility.

However, in recent years, as the use of portable display devices such as mobile phones, tablet PCs, PDAs, notebook computers, etc. increases rapidly, protection of privacy in public places is emerging as a new issue. When using a portable display device in such a public place, it is preferable that the display device has a narrow viewing angle in order to protect privacy.

Accordingly, there is a need for a research on a display device in which a privacy mode having a narrow viewing angle and a normal mode having a reference viewing angle can be switched according to a situation in the portable display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

A problem to be solved by the disclosure is to provide a display device that can be controlled to have a narrow viewing angle or a reference viewing angle according to a user's situation, by way of non-limiting example.

In order to solve the above problem or problems, a display device according to an embodiment may include a display panel including a display surface having a Lambertian light emission distribution; and a viewing angle modulator disposed on the display panel.

The viewing angle modulator may include a first refractive layer including a diffraction structure on a surface; a refractive index conversion layer disposed on the first refractive layer and including an electro-optical material having a refractive index that changes when a voltage is applied to the electro-optical material; and a second refractive layer disposed on the refractive index conversion layer.

The refractive index conversion layer may include a base layer; and an optical structure disposed on the base layer and that changes a path of light incident on a surface facing the second refractive layer.

The optical structure may be one of a prism structure and a convex lens structure.

The viewing angle modulator may include a normal mode that sets a viewing angle of the display panel to a reference viewing angle when the voltage is not applied to the electro-optical material of the refractive index conversion layer; and a private mode that sets the viewing angle of the display panel to be narrower than the reference viewing angle when the voltage is applied to the electro-optical material of the refractive index conversion layer.

The refractive index conversion layer may divide incident light incident on a first interface between the first refractive layer and the refractive index conversion layer into first exit light traveling in a first path and second exit light traveling in a second path, through the diffraction structure when the voltage is applied to the electro-optical material of the refractive index conversion layer.

The first exit light may be incident on a second interface between the optical structure and the second refractive layer in a first incident angle range, and the second exit light may be incident on the second interface in a second incident angle range having an angle smaller than an angle of the first incident angle range.

The first exit light may not pass through the display surface of the display panel, the second exit light may pass through the display surface of the display panel, and an exit angle of the second exit light may be smaller than an exit angle range of the reference viewing angle.

The first refractive layer may have a first refractive index, the second refractive layer may have a second refractive index, and the first refractive index and the second refractive index may be same.

The electro-optical material may be a liquid crystal including a material having a birefringence having an ordinary ray refractive index and an extraordinary ray refractive index.

The liquid crystal may have the extraordinary ray refractive index when the voltage is applied to the electro-optical material of the refractive index conversion layer and may have the ordinary ray refractive index when the voltage is not applied to the electro-optical material of the refractive index conversion layer.

The first refractive index, the second refractive index, and the ordinary ray refractive index may be same.

The refractive index conversion layer may include the electro-optical material only in the base layer, and the optical structure may have a third refractive index.

The electro-optical material may be a liquid crystal including a material having a birefringence having an ordinary ray refractive index and an extraordinary ray refractive index.

The liquid crystal may have the extraordinary ray refractive index when the voltage is applied to the electro-optical material of the refractive index conversion layer and may have the ordinary ray refractive index when the voltage is not applied to the electro-optical material of the refractive index conversion layer.

The first refractive index, the second refractive index, and the ordinary ray refractive index may be same, and the third refractive index may be greater than the first refractive index and the second refractive index and smaller than the ordinary ray refractive index.

The electro-optical material may be a Polymer Network Liquid Crystal (PNLC) including a liquid crystal stabilized by a polymer network having a three-dimensional net structure from an outer surface to an inside of the electro-optical material.

The liquid crystal may include a material having a birefringence having an ordinary ray refractive index and an extraordinary ray refractive index.

The PNLC may be divided into domains including the liquid crystal by the polymer network.

The domains may have the extraordinary ray refractive index when the voltage is applied to the PNLC, and a first domain of the domains may have the ordinary ray refractive index and a second domain of the domains may have the extraordinary ray refractive index when the voltage is not applied to the PNLC.

The second domain may scatter incident light.

The first refractive index, the second refractive index, and the ordinary ray refractive index may be same.

BRIEF DESCRIPTION OF THE DRAWINGS

The accompanying drawings, which are included to provide a further understanding of the disclosure, and are incorporated in and constitute a part of this specification, illustrate embodiments of the disclosure, and, together with the description, serve to explain principles of the disclosure, in which:

FIG. 1 is a schematic perspective view of a display device according to an embodiment.

FIG. 2 is a schematic cross-sectional view of the display device shown in FIG. 1.

FIG. 3 is a schematic plan view of a display panel included in the display device according to an embodiment.

DETAILED DESCRIPTION OF THE EMBODIMENTS

Figure 4:
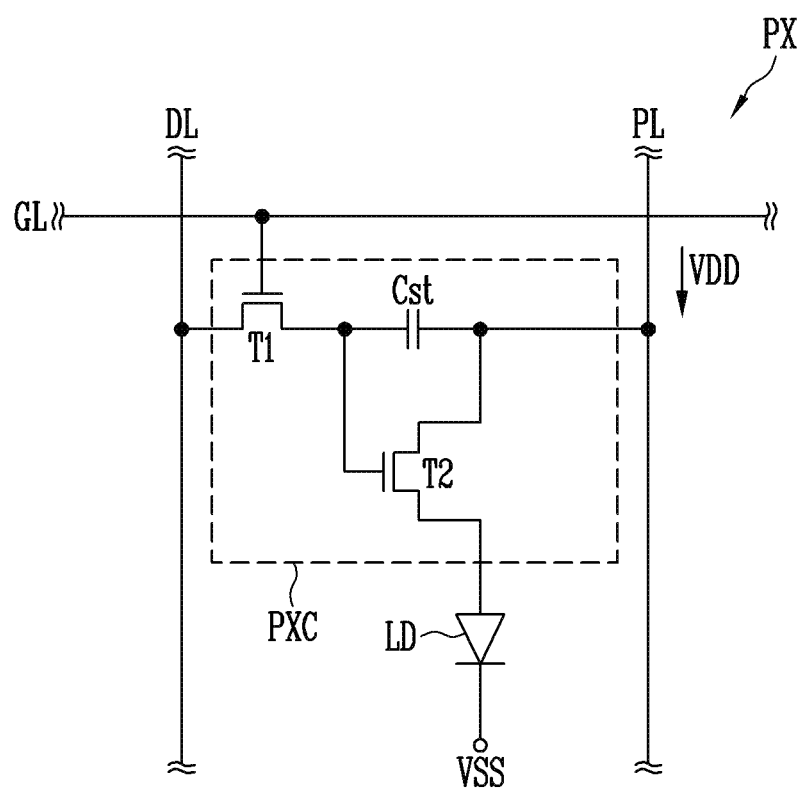
FIG. 4 is a schematic diagram of an equivalent circuit of a pixel shown in FIG. 3.

Advantages and features of the disclosure, and methods for accomplishing the same will be more clearly understood from embodiments described below with reference to the accompanying drawings. However, the disclosure is not limited to the following embodiments but may be implemented in various different forms. The embodiments are provided only to complete the disclosure and to fully inform a person having ordinary skill in the art to which the disclosure pertains the scope of the disclosure. The disclosure may be defined by the scope of the appended claims.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

A case where a first element or layer is designated as being disposed "on" a second element or layer may include cases where the first element or layer is disposed directly on the second element or layer and where an additional element or layer intervenes between the first and second elements or layers. Like reference numerals generally refer to like elements throughout the disclosure. Shapes, sizes, ratios, angles, numbers, and the like shown in the drawings for describing the embodiments are by way of example, and thus, the disclosure is not limited thereto.

Although the terms first, second, etc. may be used herein to describe various components, these components should not be limited by these terms. These terms are merely used to distinguish one component from another component. Thus, a first component described below may be a second component within the technical spirit of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

Features of each of the embodiments of the disclosure can be coupled or combined with each other, partly or wholly, and may be variously modified. Each of the embodiments may be implemented independently of each other, or may be implemented together.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described in detail with reference to the accompanying drawings.

FIG. 1 is a schematic perspective view of a display device according to an embodiment. FIG. 2 is a schematic cross-sectional view of the display device shown in FIG. 1.

Referring to FIGS. 1 and 2, a display device 1 may include a display surface IS on which an image is displayed. The display surface IS may be parallel to a surface defined by a first direction DR1 and a second direction DR2. A normal direction of the display surface IS, for example, a thickness direction of the display device 1 may be indicated in a third direction DR3. A front surface (or upper surface) and a rear surface (or lower surface) of each member may be divided by the third direction DR3. However, directions indicated by the first to third directions DR1, DR2, and DR3 may be a relative concept and may be converted to other directions.

For example, the display device 1 in which the display surface IS has a substantially planar shape is shown in FIG. 1, but the disclosure is not limited thereto. The display device 1 may include a curved display surface or a three-dimensional display surface (polygonal columnar display surface) including display areas indicating different directions.

In an embodiment, the display device 1 may be a rigid display device or a flexible display device. FIG. 1 shows a portable display device as an example to which the display device 1 according to an embodiment is applied. The portable display device may include a mobile phone, a tablet PC, a personal digital assistant (PDA), a notebook computer, a portable multimedia player (PMP), a game console, and the like within the spirit and the scope of the disclosure. However, the disclosure is not limited to a specific type of the display device 1. For example, in an embodiment of the disclosure, the display device 1 may be used for large-sized electronic equipment such as a television or an external billboard, as well as small and medium-sized electronic equipment such as a personal computer, a car navigation device, a smart watch, and a camera.

In an embodiment, the display device 1 may have a substantially rectangular shape when viewed on a plane. The display device 1 may include both long sides extending in the first direction DR1 and both short sides extending in the second direction DR2. A corner portion where a long side and a short side of the display device 1 meet may be a right angle. However, the disclosure is not limited thereto, and the corner portion may be a curved surface. By way of example, the corner portion of the display device 1 may be chamfered to reduce the risk of damage. The substantially planar shape of the display device 1 is not limited to the above examples, and may have a substantially circular shape or other shape.

The display surface IS of the display device 1 may include a display area DM-DA in which an image is displayed and a non-display area DM-NDA adjacent to the display area DM-DA. The non-display area DM-NDA may be an area in which the image is not displayed.

In an embodiment, the display area DM-DA may have a substantially rectangular shape. In an embodiment, a corner portion of the display area DM-DA may form a curved surface as shown in FIG. 1, but the disclosure is not limited thereto. Hereinafter, a case in which the corner portion of the display area DM-DA forms the curved surface will be described as an example.

The non-display area DM-NDA may surround or may be adjacent to the display area DM-DA. However, the disclosure is not limited thereto, and the shape of the display area DM-DA and the shape of the non-display area DM-NDA may be relatively designed.

Unless otherwise defined, in the specification, "upper", "upper side", "upper part", "top", and "upper surface" may mean a side to which the arrow is directed in the third direction DR3 crossing or intersecting the first direction DR1 and the second direction DR2 based on the drawings, and "lower", "lower side", "lower part", "bottom", and "lower surface" may mean a side opposite to the direction which the arrow is directed in the third direction DR3 based on the drawings.

Referring to FIG. 2, the display device 1 may include a display panel DP and a viewing angle modulator VAM. The viewing angle modulator VAM may be disposed on the display panel DP, and a window member WM may be disposed on the viewing angle modulator VAM. Although not shown separately, the display device 1 may further include a protection member disposed below the display panel DP and an anti-reflection member disposed above the window member WM.

The display panel DP may be a display panel including a self-light emitting element. In an embodiment, the self-light emitting element may include at least one of an organic light emitting element (organic light emitting diode), a quantum dot light emitting element (quantum dot light emitting diode), an inorganic material-based micro light emitting diode (for example, micro LED), and an inorganic material-based nano light emitting diode (for example, nano LED). Hereinafter, for convenience of description, a case where the self-light emitting element is the organic light emitting element is described as an example.

The display panel DP may include a substrate SUB, a circuit element layer DP-CL, a display element layer DP-LD, and a thin film encapsulation layer TFE sequentially disposed on the substrate SUB.

In an embodiment, the substrate SUB may be made of an insulating material such as glass, quartz, polymer resin, or the like within the spirit and the scope of the disclosure. Examples of the polymer resin may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination thereof. The substrate SUB may also include a metal material.

The substrate SUB may be a rigid substrate or a flexible substrate capable of bending, folding, rolling, or the like within the spirit and the scope of the disclosure. An example of a material constituting the flexible substrate may include polyimide (PI), but is not limited thereto.

The display area DM-DA and the non-display area DM-NDA described with reference to FIG. 1 may be defined in the same manner in the substrate SUB.

The circuit element layer DP-CL may include at least one intermediate insulating layer and a circuit element. The intermediate insulating layer may include at least one intermediate inorganic layer and at least one intermediate organic layer. The circuit element may include signal lines, a pixel driving circuit, and the like within the spirit and the scope of the disclosure. The circuit element layer DP-CL may be formed through a process of forming an insulating layer through coating, deposition, or the like, and a process of patterning a conductor layer and/or a semiconductor layer through a photolithography process.

The display element layer DP-LD may include a self-light emitting element. For example, the self-light emitting element may be an organic light emitting element. The display element layer DP-LD may further include an organic layer such as a pixel defining layer.

The thin film encapsulation layer TFE may seal the display element layer DP-LD. The thin film encapsulation layer TFE may include at least one inorganic layer (hereinafter, an encapsulation inorganic layer). The thin film encapsulation layer TFE may further include at least one organic layer (hereinafter, an encapsulation organic layer). The encapsulation inorganic layer may protect the display element layer DP-LD from moisture or oxygen, and the encapsulation organic layer may protect the display element layer DP-LD from foreign substances such as dust particles. The encapsulating inorganic layer may include a silicon nitride layer, a silicon oxy nitride layer, a silicon oxide layer, a titanium oxide layer, an aluminum oxide layer, or the like within the spirit and the scope of the disclosure. The encapsulation organic layer may include an acrylic organic layer, but is not limited thereto.

In an embodiment, the thin film encapsulation layer TFE may be replaced with an encapsulation substrate or the like within the spirit and the scope of the disclosure. The encapsulation substrate may seal the display element layer DP-LD with a sealant.

The window member WM may be disposed on the display panel DP to protect the display panel DP, while transmitting light emitted from the display panel DP. For example, the window member WM may be disposed on the viewing angle modulator VAM.

The window member WM may be disposed to overlap the display panel DP and cover or overlap the entire surface of the display panel DP. The window member WM may have a shape substantially similar to the display panel DP when viewed on a plane, but may have a size larger than that of the display panel DP. For example, the window member WM may protrude outward from the display panel DP at both short sides of the display device 1. The window member WM may protrude from the display panel DP even at both long sides of the display device 1, but the protruding distance may be greater in the case of both short sides. The window member WM may have a substantially rectangular shape including both long sides and both short sides, similar to the substantially planar shape of the display device 1.

The window member WM may include one surface or a surface and the other surface or another surface. In case that the window member WM is mounted or disposed on the display device 1, one surface or a surface of the window member WM may be a surface facing the display panel, and the other surface or another surface of the window member WM may be a surface on which the image is emitted.

The viewing angle modulator VAM may be disposed on the display panel DP. For example, the viewing angle modulator VAM may be disposed between the display panel DP and the window member WM. Although not shown in detail in FIG. 2, the viewing angle modulator VAM may include refractive layers, and the refractive layers may include a layer having a fixed refractive index and a layer having a variable refractive index. The viewing angle modulator VAM may change the viewing angle of the display device 1 (or the display panel DP). For example, the display device 1 (or the display panel DP) may include a normal mode having a reference viewing angle and a private mode having a viewing angle narrower than the reference viewing angle. Assuming that several users use the display device 1 at the same time, or one user uses the display device 1 at an oblique angle instead of the front, the reference viewing angle may mean a viewing angle set in advance to secure visibility. The viewing angle modulator VAM will be described later in detail with reference to FIGS. 6A to 7B.

Figure 5:
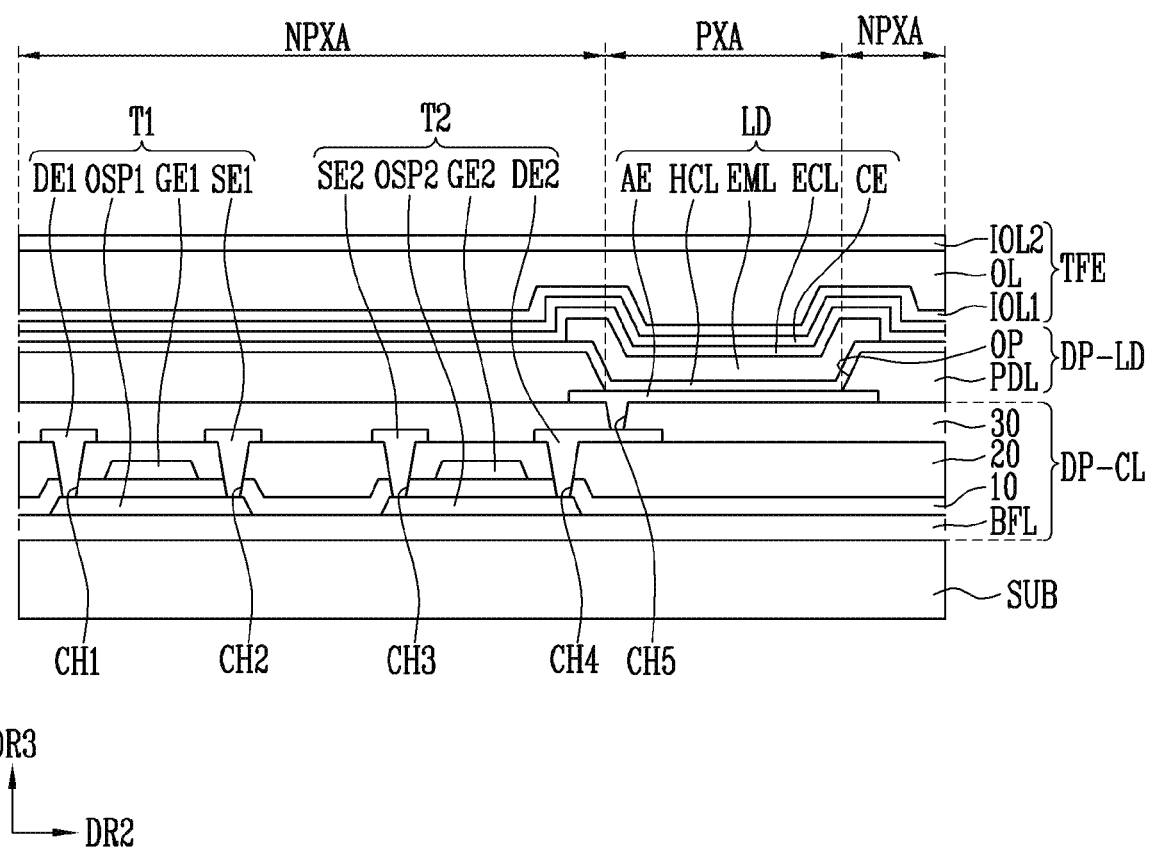
FIG. 5 is a schematic cross-sectional view of the pixel shown in FIG. 4.

FIG. 3 is a plan view of a display panel included in the display device according to an embodiment. FIG. 4 is a schematic diagram of an equivalent circuit of a pixel shown in FIG. 3. FIG. 5 is a schematic cross-sectional view of the pixel shown in FIG. 4.

Referring to FIGS. 3, 4 and 5, when viewed on a plane, the substrate SUB of the display panel DP may include a main area MR including a display area DA and a non-display area NDA, a bending area BD connected to one side or a side of the main area MR, and a sub-area SR connected to one side or a side of the bending area BD and overlapping the main area MR in the third direction DR3 during bending.

In an embodiment, the non-display area NDA may be defined along an edge of the display area DA. The display area DA and the non-display area NDA of the display panel DP may correspond to the display area DM-DA and the non-display area DM-NDA of the display device 1 shown in FIG. 1, respectively. The display area DA and the non-display area NDA of the display panel DP need not necessarily be the same as the display area DM-DA and the non-display area DM-NDA of the display device 1, and may be changed according to the structure or design of the display panel DP. In an embodiment, a corner portion of the display area DA of the display panel DP may have a substantially curved shape.

The bending area BD may be connected to the main area MR. For example, the bending area BD may be connected through one short side or a short side of the main area MR. The width of the bending area BD may be smaller than the width (width of the short side) of the main area MR. A connection portion between the main area MR and the bending area BD may have a substantially L-shaped cutting shape.

In the bending area BD, the substrate SUB may be bent with a curvature in a downward direction in a thickness direction, for example, in a direction opposite to the display surface. The bending area BD may have a constant radius of curvature, but is not limited thereto and may have a different radius of curvature for each section. As the substrate SUB is bent in the bending area BD, the surface of the substrate SUB may be reversed. For example, one surface or a surface of the substrate SUB facing the upper side may be bent to face the outside through the bending area BD, and face the lower side again.

The sub-area SR may extend from the bending area BD. The sub-area SR may start after bending is completed and extend in a direction parallel to the main area MR. The sub-area SR may overlap the main area MR in the thickness direction of the substrate SUB. The sub-area SR may overlap the non-display area NDA of the edge of the main area MR, and may also overlap the display area DA of the main area MR.

The width of the sub-area SR may be the same as the width of the bending area BD, but is not limited thereto.

The display panel DP may include a driving circuit GDC, signal lines SGL, and pixels PX. The pixels PX may be disposed in the display area DA. Each of the pixels PX may include a self-light emitting element (for example, an organic light emitting element) and a pixel driving circuit electrically connected to the self-light emitting element. The driving circuit GDC, the signal lines SGL, and the pixel driving circuit may be included in the circuit element layer DP-CL shown in FIG. 2.

The driving circuit GDC may include a scan driving circuit. The driving circuit GDC may generate scan signals in response to a driving control signal CSL, and sequentially output the scan signals to scan lines GL to be described later.

The driving circuit GDC may include thin film transistors formed through the same process as a pixel driving circuit PXC, for example, a low temperature polycrystalline silicon (LTPS) process or a low temperature polycrystalline oxide (LTPO) process.

The display panel DP may include signal pads DP-PD and PW-PD electrically connected to ends of the signal lines SGL. The signal pads DP-PD and PW-PD may be a kind of circuit element. An area in which the signal pads DP-PD and PW-PD are disposed among the non-display area NDA may be defined as a pad area. A display driving substrate FPCB may be electrically connected to the pad area. The display driving substrate FPCB may be a flexible printed circuit board or film. A chip mounting area may be defined on the display driving substrate FPCB, and a driving chip IC such as a timing control circuit in a chip shape may be mounted or disposed on the chip mounting area.

FIG. 4 shows a pixel PX electrically connected to one scan line GL, one data line DL, and a power source line PL as an example. The configuration or structure of the pixel PX is not limited thereto and may be modified and implemented.

The pixel PX may include a light emitting element LD and the pixel driving circuit PXC for driving the light emitting element LD. The light emitting element LD may be a top emission type diode or a bottom emission type diode. The pixel driving circuit PXC may include a first transistor T1 (or a switching transistor), a second transistor T2 (or a driving transistor), and a capacitor Cst. A first power source voltage VDD may be provided to the second transistor T2, and a second power source voltage VSS may be provided to the light emitting element LD. The second power source voltage VSS may be a voltage lower than the first power source voltage VDD.

The first transistor T1 may output a data signal applied to the data line DL in response to a scan signal applied to the scan line GL. The capacitor Cst may charge a voltage corresponding to the data signal received from the first transistor T1.

The second transistor T2 may be electrically connected to the light emitting element LD. The second transistor T2 may control a driving current flowing through the light emitting element LD in response to the amount of charge stored in the capacitor Cst. The light emitting element LD may emit light during a turned-on period of the second transistor T2.

The power source line PL may be electrically connected to the second transistor T2 to supply the first power source voltage VDD to the second transistor T2.

FIG. 5 is a partial schematic cross-sectional view of the display panel DP corresponding to the equivalent circuit shown in FIG. 4.

The circuit element layer DP-CL, the display element layer DP-LD, and the thin film encapsulation layer TFE may be sequentially disposed on the substrate SUB. In an embodiment, the circuit element layer DP-CL may include a buffer layer BFL made of an inorganic layer, a first intermediate inorganic layer 10, a second intermediate inorganic layer 20, and an intermediate organic layer 30 made of an organic layer. Materials of the inorganic layer and the organic layer are not particularly limited, and the buffer layer BFL may be selectively disposed or omitted in an embodiment.

A semiconductor pattern OSP1 (hereinafter, referred to as a first semiconductor pattern) of the first transistor T1 and a semiconductor pattern OSP2 (hereinafter, referred to as a second semiconductor pattern) of the second transistor T2 may be disposed on the buffer layer BFL. The first semiconductor pattern OSP1 and the second semiconductor pattern OSP2 may be selected from amorphous silicon, polysilicon, and metal oxide semiconductors.

The first intermediate inorganic layer 10 may be disposed on the first semiconductor pattern OSP1 and the second semiconductor pattern OSP2. A control electrode GE1 (hereinafter, referred to as a first control electrode) of the first transistor T1 and a control electrode GE2 (hereinafter, referred to as a second control electrode) of the second transistor T2 may be disposed on the first intermediate inorganic layer 10. The first control electrode GE1 and the second control electrode GE2 may be manufactured through the same photolithography process as the scan lines GL (refer to FIG. 3).

The second intermediate inorganic layer 20 covering or overlapping the first control electrode GE1 and the second control electrode GE2 may be disposed on the first intermediate inorganic layer 10. An input electrode SE1 (hereinafter, referred to as a first input electrode) and an output electrode DE1 (hereinafter, referred to as a first output electrode) of the first transistor T1, and an input electrode SE2 (hereinafter, referred to as a second input electrode) and an output electrode DE2 (hereinafter, referred to as a second output electrode) of the second transistor T2 may be disposed on the second intermediate inorganic layer 20.

The first input electrode SE1 and the first output electrode DE1 may be electrically connected to the first semiconductor pattern OSP1 through a first through hole CH1 and a second through hole CH2 penetrating the first intermediate inorganic layer 10 and the second intermediate inorganic layer 20, respectively. The second input electrode SE2 and the second output electrode DE2 may be electrically connected to the second semiconductor pattern OSP2 through a third through hole CH3 and a fourth through hole CH4 penetrating the first intermediate inorganic layer 10 and the second intermediate inorganic layer 20, respectively. In an embodiment, some or a number of the first transistor T1 and the second transistor T2 may be transformed into a bottom gate structure.

The intermediate organic layer 30 covering or overlapping the first input electrode SE1, the second input electrode SE2, the first output electrode DE1, and the second output electrode DE2 may be disposed on the second intermediate inorganic layer 20. The intermediate organic layer 30 may provide a flat surface.

The display element layer DP-LD may be disposed on the intermediate organic layer 30. The display element layer DP-LD may include a pixel defining layer PDL and the light emitting element LD. The pixel defining layer PDL may include an organic material. A first electrode AE may be disposed on the intermediate organic layer 30. The first electrode AE may be electrically connected to the second output electrode DE2 through a fifth through hole CH5 penetrating the intermediate organic layer 30. An opening OP may be defined in the pixel defining layer PDL. The opening OP of the pixel defining layer PDL may expose at least a portion of the first electrode AE. In an embodiment, the pixel defining layer PDL may be omitted.

The pixel PX may be disposed in the display area DP-DA. The display area DP-DA may include an emission area PXA and a non-emission area NPXA adjacent to the emission area PXA. The non-emission area NPXA may surround the emission area PXA. In the present embodiment, the emission area PXA may be defined to correspond to a partial area of the first electrode AE exposed by the opening OP.

In an embodiment, the emission area PXA may overlap at least one of the first and second transistors T1 and T2. The opening OP may be wider, and the first electrode AE and a light emitting layer EML to be described later may also be wider.

A hole control layer HCL may be commonly disposed in the emission area PXA and the non-emission area NPXA. Although not shown separately, a common layer such as the hole control layer HCL may be formed in common in the pixels PX (refer to FIG. 3).

The light emitting layer EML may be disposed on the hole control layer HCL. The light emitting layer EML may be disposed in an area corresponding to the opening OP. For example, the light emitting layer EML may be formed separately on each of the pixels PX. The light emitting layer EML may include an organic material and/or an inorganic material. The light emitting layer EML may generate colored light of a color.

In an embodiment, the patterned light emitting layer EML is shown as an example, but the light emitting layer EML may be commonly disposed on the pixels PX. The light emitting layer EML may have a multilayer structure referred to as a tandem.

An electron control layer ECL may be disposed on the light emitting layer EML. Although not shown separately, the electron control layer ECL may be commonly formed or disposed on the pixels PX (refer to FIG. 3). A second electrode CE may be disposed on the electron control layer ECL. The second electrode CE may be commonly disposed on the pixels PX.

The thin film encapsulation layer TFE may be disposed on the second electrode CE. The thin film encapsulation layer TFE may be commonly disposed on the pixels PX. In an embodiment, the thin film encapsulation layer TFE may cover or overlap or directly cover or overlap the second electrode CE. In an embodiment, a capping layer covering or overlapping the second electrode CE may be further disposed between the thin film encapsulation layer TFE and the second electrode CE. The thin film encapsulation layer TFE may cover or overlap or directly cover or overlap the capping layer.

In an embodiment, the thin film encapsulation layer TFE may include a first encapsulation inorganic layer IOL1, an encapsulation organic layer OL, and a second encapsulation inorganic layer IOL2 sequentially stacked on the second electrode CE.

In an embodiment, the first encapsulation inorganic layer IOL1 and the second encapsulation inorganic layer IOL2 may be formed of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, or the like within the spirit and the scope of the disclosure.

In an embodiment, the encapsulating organic layer OL may be formed of an acrylic resin, a methacrylic resin, a polyisoprene, a vinyl resin, an epoxy resin, a urethane resin, a cellulose resin, a perylene resin, or the like within the spirit and the scope of the disclosure.

However, the structure of the thin film encapsulation layer TFE is not limited to the above-described example, and the stacked structure of the thin film encapsulation layer TFE may be variously changed.

In an embodiment, the light emitting element LD may further include a resonance structure for controlling a resonance distance of the light generated from the light emitting layer EML. The resonant structure may be disposed between the first electrode AE and the second electrode CE, and the thickness of the resonant structure may be determined according to a wavelength of the light generated by the light emitting layer EML.

In FIGS. 4 and 5, a case where the pixel PX may include two thin film transistors and one storage capacitor has been described, but the disclosure is not limited thereto.

Figure 6A:
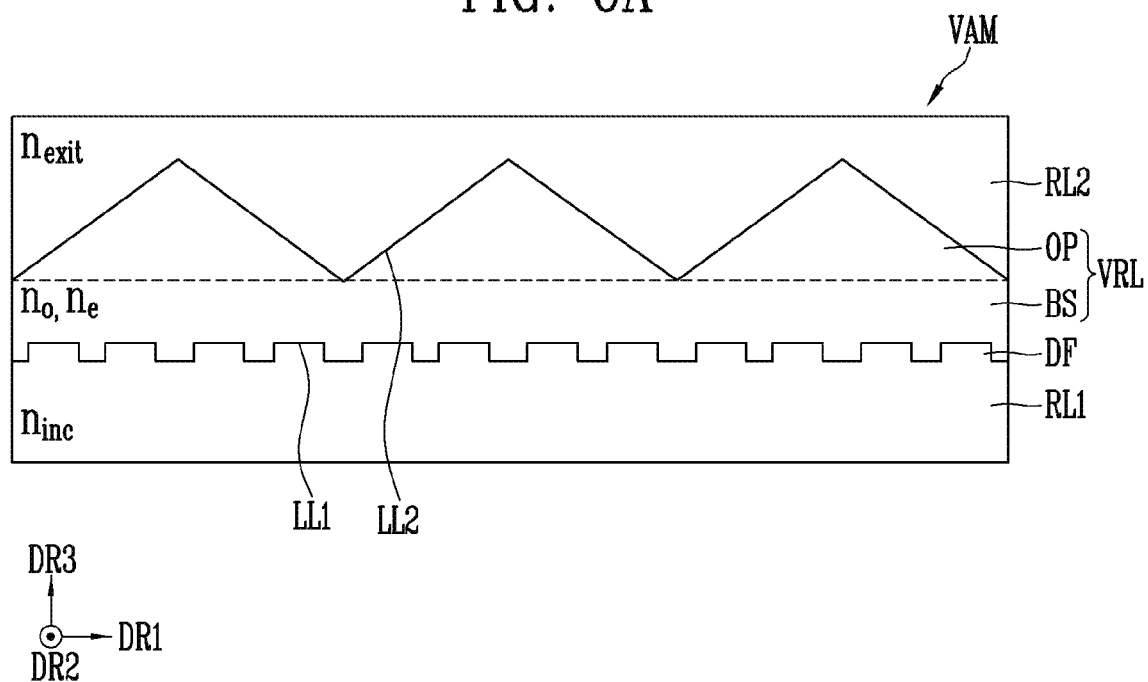
FIGS. 6A and 6B are schematic cross-sectional views of a viewing angle modulator of FIG. 2 according to an embodiment.
Figure 6B:
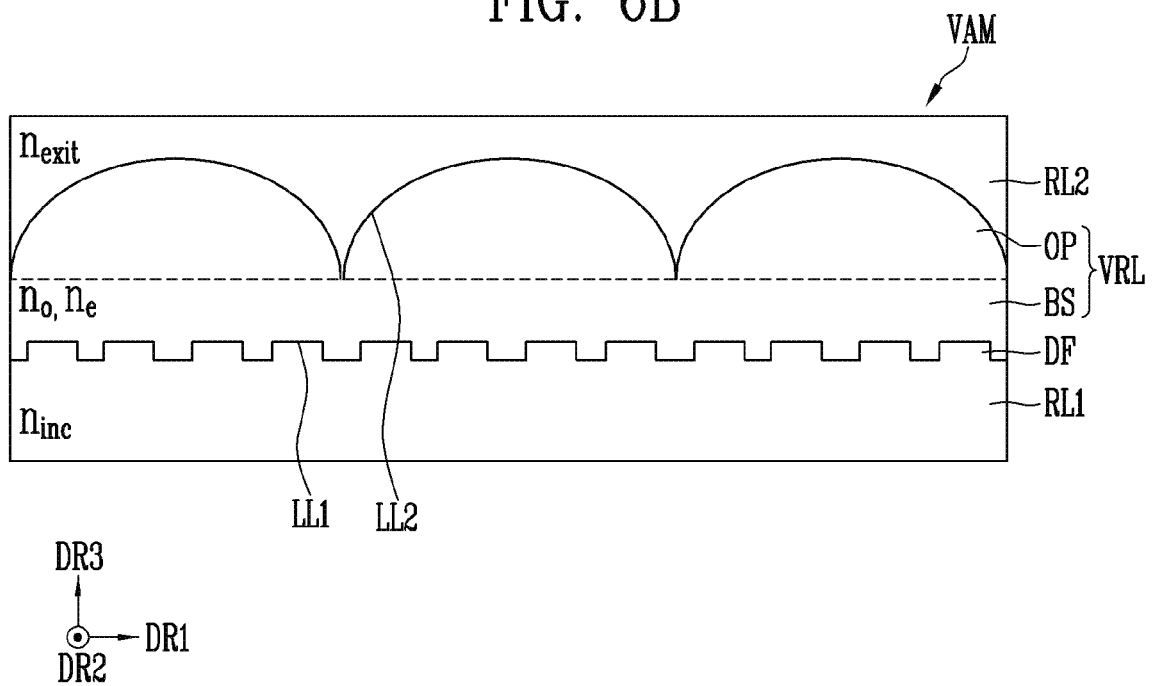

FIGS. 6A and 6B are schematic cross-sectional views of a viewing angle modulator of FIG. 2 according to an embodiment.

Referring to FIGS. 2, 6A and 6B, the viewing angle modulator VAM may include a first refractive layer RL1, a refractive index conversion layer VRL, and a second refractive layer RL2 that may be sequentially stacked each other.

The first refractive layer RL1 may be disposed on the display panel DP (refer to FIG. 2). For example, the first refractive layer RL1 may be formed or disposed on the thin film encapsulation layer TFE. The first refractive layer RL1 may be made of a photocurable isotropic polymer having a first refractive index $n_{inc}$. For example, the isotropic polymer may be any one of acrylic resin, polycarbonate, and cycloolefin polymer (COP).

The first refractive layer RL1 may include a diffractive structure DF on a first interface LL1 facing the refractive index conversion layer VRL. The diffractive structure DF may change an optical path by diffracting incident light incident on the first interface LL1. The diffractive structure DF may be a concave-convex portion having a constant period in a substantially stripe shape in a plan view. For example, the diffractive structure DF may be the concave-convex portion extending in the second direction DR2 and periodically arranged or disposed along the first direction DR1. The cross-sectional shape of the concave-convex portion may be substantially a square, and the period thereof may be about 0.1 μm.

The diffractive structure DF may be formed of the same material or similar material as the first refractive layer RL1 at the same time. The diffractive structure DF may be made of the photocurable isotropic polymer having the first refractive index $n_{inc}$. For example, the isotropic polymer may be any one of acrylic resin, polycarbonate, and cycloolefin polymer (COP).

However, the disclosure is not limited thereto, and the diffractive structure DF may be formed by forming the first refractive layer RL1 having a flat surface, and separately adding the concave-convex portion on the flat surface. The diffractive structure DF may be formed of a metal oxide such as silica ($SiO_2$), titania ($TiO_2$), and indium tin oxide (ITO), or a nitride-based metal such as silicon nitride (SiN).

The refractive index conversion layer VRL may be disposed on the first refractive layer RL1. The refractive index conversion layer VRL may include a base layer BS and an optical structure OP. The base layer BS and the optical structure OP may be simultaneously formed of the same material or similar material.

The base layer BS may be disposed on the first refractive layer RL1. The base layer BS may have a shape complementary to the concave-convex portion of the diffractive structure DF on a surface facing the first refractive layer RL1, and may be formed to have a constant thickness between the first refractive layer RL1 and the optical structure OP.

The optical structure OP may be disposed on the base layer BS. The optical structure OP may change an optical path by refracting incident light incident on a second interface LL2 facing the second refractive layer RL2. As shown in FIG. 6A, the optical structure OP may have a prism structure. The cross-sectional shape of the optical structure OP may have a substantially triangular shape.

However, the disclosure is not limited thereto. For example, as shown in FIG. 6B, the optical structure OP may have a lens structure. The cross-sectional shape of the optical structure OP may have a substantially semicircular shape. In case that the cross-sectional shape of the optical structure OP has the substantially semicircular shape, an exit angle of the light exits through the optical structure OP may be set to be narrower than that of the optical structure OP having the substantially triangular shape. For example, the private mode of the display device 1 may be further improved.

The refractive index conversion layer VRL may include an electro-optical material whose refractive index changes in case that a voltage is applied. The electro-optical material may be a liquid crystal including a material having birefringence having an ordinary ray refractive index $n_o$ and an extraordinary ray refractive index $n_e$. The liquid crystal may have the extraordinary ray refractive index $n_e$ in case that the voltage is applied, and may have the ordinary ray refractive index $n_o$ in case that the voltage is not applied.

Referring again to FIG. 6A, the second refractive layer RL2 may be disposed on the refractive index conversion layer VRL. For example, the second refractive layer RL2 may be disposed on the optical structure OP. The second refractive layer RL2 may be made of a photocurable isotropic polymer having a second refractive index $n_{exit}$. For example, the isotropic polymer may be any one of acrylic resin, polycarbonate, and cycloolefin polymer (COP).

According to an embodiment, the first refractive index $n_{inc}$, the second refractive index $n_{exit}$, and the ordinary ray refractive index $n_o$ may have the same size, and the extraordinary ray refractive index $n_e$ may have a size different from the first refractive index $n_{inc}$, the second refractive index $n_{exit}$, and the ordinary ray refractive index $n_o$. For example, the extraordinary ray refractive index $n_e$ may be greater than the first refractive index $n_{inc}$, the second refractive index $n_{exit}$, and the ordinary ray refractive index $n_o$.

Figure 7A:
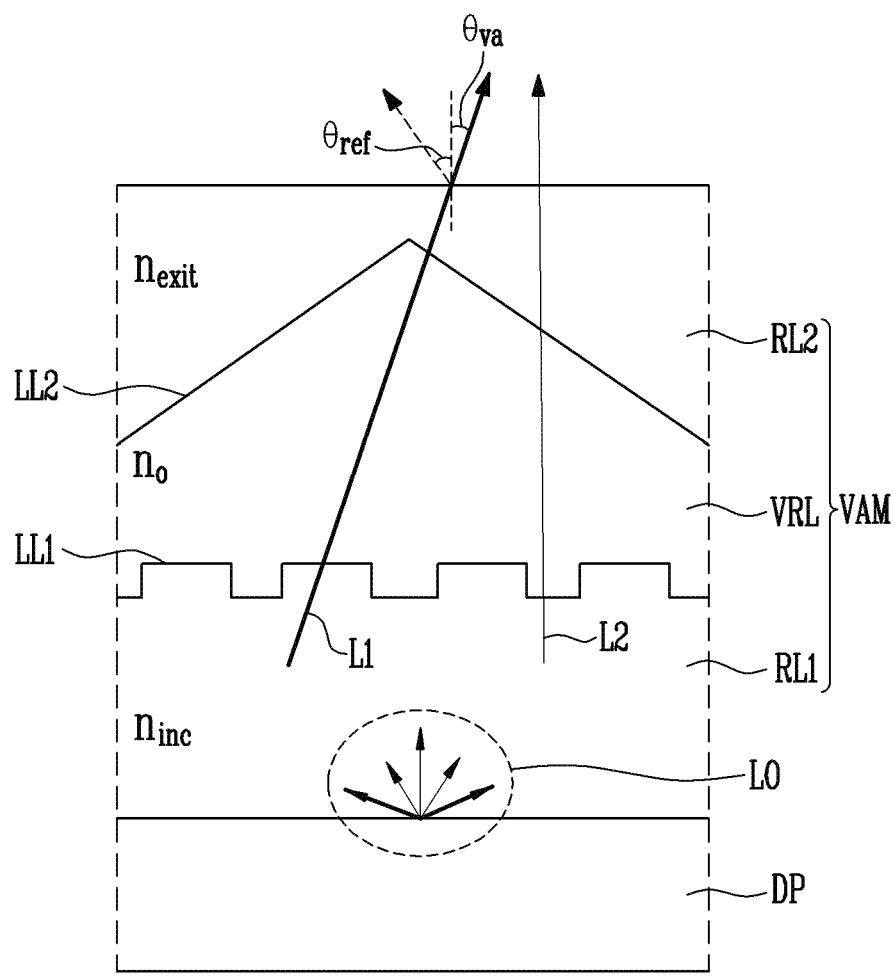
FIG. 7A is a diagram for explaining a normal mode of the display device.
Figure 7B:
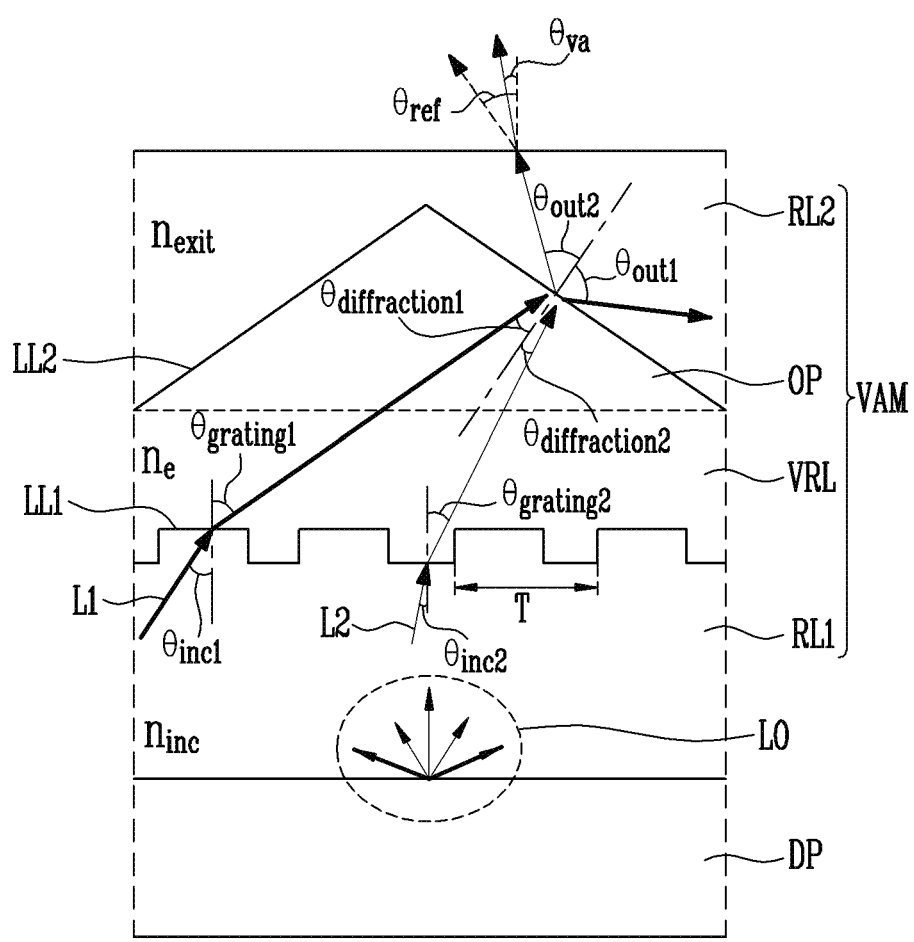
FIG. 7B is a diagram for explaining a private mode of the display device.

FIG. 7A is a diagram for explaining a normal mode of the display device. FIG. 7B is a diagram for explaining a private mode of the display device.

Referring to FIGS. 2, 6A, 6B, and 7A, in case that a voltage is not applied to the viewing angle modulator VAM (or the refractive index conversion layer VRL), the display device 1 may be operated in the normal mode in which a range of the viewing angle of the display panel DP is set equal to a range of the reference viewing angle.

In case that the voltage is not applied to the viewing angle modulator VAM (or the refractive index conversion layer VRL), refractive indexes of the first refractive layer RL1, the refractive index conversion layer VRL, and the second refractive layer RL2 may be the same. For example, the first refractive index $n_{inc}$ of the first refractive layer RL1 and the second refractive index $n_{exit}$ of the second refractive layer RL2 may be previously set to have the same size as the ordinary ray refractive index $n_o$. The refractive index conversion layer VRL may include an electro-optical material. The electro-optical material may be a liquid crystal including a material having birefringence having the ordinary ray refractive index $n_o$ and the extraordinary ray refractive index $n_e$. The liquid crystal may have the ordinary ray refractive index $n_o$ in case that a voltage is not applied. For example, the refractive indexes of the first refractive layer RL1, the refractive index conversion layer VRL, and the second refractive layer RL2 may all be the same as the ordinary ray refractive index $n_o$.

Light L0 emitted from the display element layer DP-LD of the display panel DP may be a Lambertian type of light. For example, one surface or a surface of the display panel DP facing the first refractive layer RL1 may be a Lambertian surface. The Lambertian surface may be a surface from which substantially the same amount of light is emitted in all directions, and an observer can perceive the light of the same size regardless of the viewing position.

Based on the interface between the display panel DP and the first refractive layer RL1, the light L0 emitted from the display element layer DP-LD of the display panel DP may include first exit light L1 having a range of a first exit angle and second exit light L2 having a range of a second exit angle. The range of the first exit angle may be larger than the range of the second exit angle.

The first refractive layer RL1, the refractive index conversion layer VRL, and the second refractive layer RL2 disposed on an optical path may have no difference in refractive index between them. Therefore, since diffraction does not occur at the first interface LL1 between the first refractive layer RL1 and the refractive index conversion layer VRL, and refraction does not occur at the second interface LL2 between the refractive index conversion layer VRL and the second refractive layer RL2, the first exit light L1 and the second exit light L2 may go straight.

For example, in case that the voltage is not applied to the viewing angle modulator VAM (or the refractive index conversion layer VRL), the display device 1 may be operated in the normal mode in which a range of an exit angle θva of the light emitted from the display panel DP for one surface or a surface of the second refractive layer RL2 is set equal to a range of a reference viewing angle θref.

Referring to FIGS. 2, 6A, 6B, and 7B, in case that the voltage is applied to the viewing angle modulator VAM (or the refractive index conversion layer VRL), the display device 1 may be operated in the private mode in which the viewing angle of the display panel DP is set narrower than the reference viewing angle.

In case that the voltage is applied to the viewing angle modulator VAM (or the refractive index conversion layer VRL), each of the first refractive index $n_{inc}$ of the first refractive layer RL1 and the second refractive index $n_{exit}$ of the second refractive layer RL2 may be different from the extraordinary ray refractive index $n_e$, which is the refractive index of the refractive index conversion layer VRL.

The first refractive index $n_{inc}$ of the first refractive layer RL1 and the second refractive index $n_{exit}$ of the second refractive layer RL2 may be preset to have the same size as the ordinary ray refractive index $n_o$. The refractive index conversion layer VRL may include an electro-optical material. The electro-optical material may be a liquid crystal including a material having birefringence having the ordinary ray refractive index $n_o$ and the extraordinary ray refractive index $n_e$. The liquid crystal may have the extraordinary ray refractive index $n_e$ in case that a voltage is applied. The extraordinary ray refractive index $n_e$ may be greater than the ordinary ray refractive index $n_o$.

The light L0 emitted from the display element layer DP-LD of the display panel DP may be a Lambertian type of light. Based on the interface between the display panel DP and the first refractive layer RL1, the light L0 emitted from the display element layer DP-LD of the display panel DP may include the first exit light L1 having the range of the first exit angle and the second exit light L2 having the range of the second exit angle. The first exit angle may be larger than the second exit angle.

Since a difference in refractive index occurs between the first refractive layer RL1 and the refractive index conversion layer VRL, the first exit light L1 and the second exit light L2 may be diffracted by the diffractive structure DF at the first interface LL1. The degree of diffraction of the first exit light L1 and the second exit light L2 may be controlled by Equation 1 (or diffraction formula) below.

$$n_e = \sin\theta_{grating} = n_{inc} \cdot \sin\theta_{inc} \pm m \cdot \frac{\lambda}{T} \quad \text{[Equation 1]}$$

Where $n_{inc}$ is the first refractive index, $n_e$ is the extraordinary ray refractive index, θinc is an incident angle θinc1 of the first exit light L1 at the first interface LL1 and an incident angle θinc2 of the second exit light L2 at the first interface LL1, θgrating is an exit angle θgrating1 of the first exit light L1 at the first interface LL1 and an exit angle θgrating2 of the second exit light L2 at the first interface LL1, m is a positive integer, λ is a wavelength of each of the first exit light L1 and the second exit light L2, and T is a period of the diffractive structure DF.

Since a difference in refractive index occurs between the refractive index conversion layer VRL and the second refractive layer RL2, the first exit light L1 and the second exit light L2 may be reflected by the optical structure OP at the second interface LL2. The degree of refraction of the first exit light L1 and the second exit light L2 may be controlled by Equation 2 (or refraction formula) below.

$$n_e \sin\theta_{diffraction} = n_{exit} \sin\theta_{out} \quad \text{[Equation 2]}$$

Where $n_{exit}$ is the second refractive index, $n_e$ is the extraordinary ray refractive index, θdiffraction is an incident angle θdiffraction1 of the first exit light L1 at the second interface LL2 and an incident angle θdiffraction2 of the second exit light L2 at the second interface LL2, and θout is an exit angle θout1 of the first exit light L1 at the second interface LL2 and an exit angle θout2 of the second exit light L2 at the second interface LL2.

For example, the refractive index conversion layer VRL may diffract the first exit light L1 and the second exit light L2 incident on the first interface LL1 through the diffractive structure DF in case that the voltage is applied. Thereafter, the first exit light L1 may be incident on the second interface LL2 in a range of a first incident angle, and the second exit light L2 may be incident on the second interface LL2 in a range of a second incident angle having an angle smaller than that of the first incident angle. Thereafter, the first exit light L1 may return to the display panel DP without passing through the display surface IS (refer to FIG. 1), and the second exit light L2 may pass through the display surface IS. At this time, the exit angle θva of the second exit light L2 with respect to one surface or a surface of the second refractive layer RL2 facing the window member WM (refer to FIG. 2) may be smaller than a range of an exit angle of the reference viewing angle θref. For example, in case that the voltage is applied to the viewing angle modulator VAM (or the refractive index conversion layer VRL), the display device 1 may be operated in the private mode in which the range of the exit angle θva of the light emitted from the display panel DP with respect to one surface or a surface of the second refractive layer RL2 is set to be narrower than the range of the reference viewing angle θref.

Hereinafter, other embodiments will be described. In the following embodiments, descriptions of the same components as those of the previously described embodiments will be omitted or simplified, and differences will be described.

Figure 8:
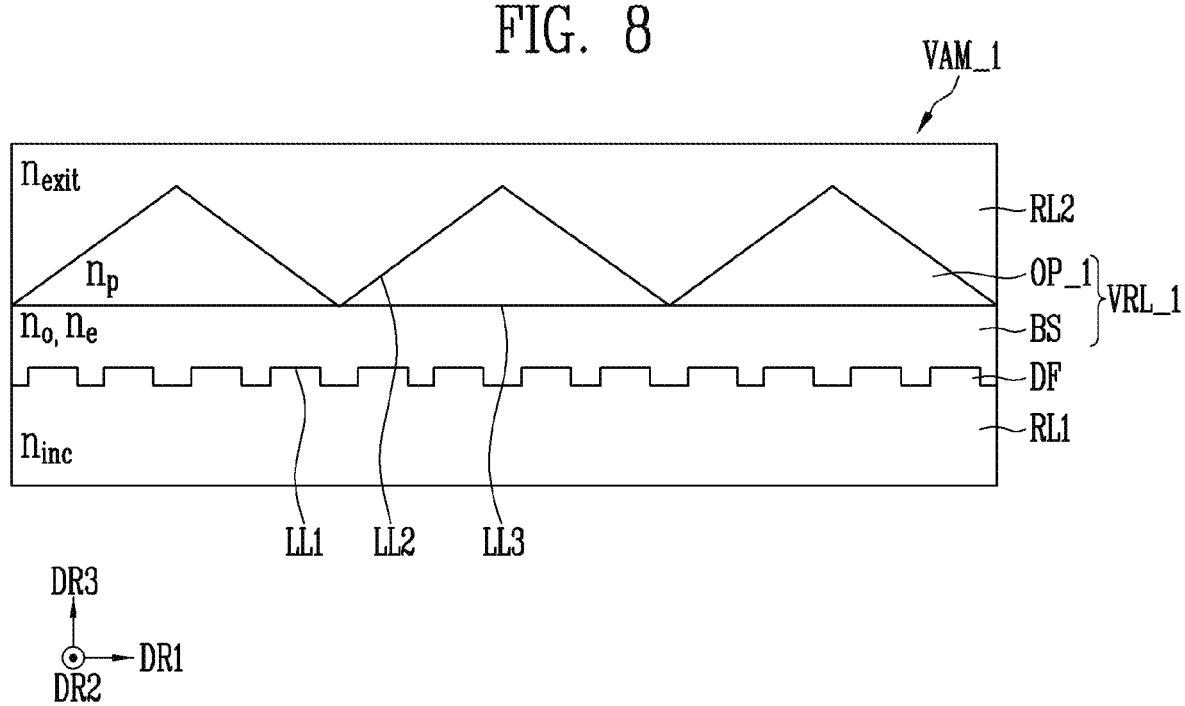
FIG. 8 is a schematic cross-sectional view of a viewing angle modulator of FIG. 2 according to an embodiment.

FIG. 8 is a substantially cross-sectional view of the viewing angle modulator of FIG. 2 according to an embodiment.

Referring to FIGS. 6A, 6B and 8, compared with an embodiment of FIGS. 6A and 6B in which the base layer BS and the optical structure OP have the same refractive index $n_o$ and $n_e$, an embodiment shown in FIG. 8 may differ in that refractive indexes $n_o$ and $n_e$ of a base layer BS included in a refractive index conversion layer VRL_1 and a refractive index $n_p$ of an optical structure OP_1 are different from each other. Hereinafter, duplicate descriptions of the same configuration or structure as in an embodiment of FIGS. 6A and 6B will be omitted, and the configuration or structure of the refractive index conversion layer VRL_1 will be described as a difference.

By way of example, the refractive index conversion layer VRL_1 may include the base layer BS and the optical structure OP_1. The refractive index conversion layer VRL_1 may be disposed on a first refractive layer RL1. The base layer BS and the optical structure OP_1 may be sequentially formed of different materials.

The base layer BS may be disposed on the first refractive layer RL1. The base layer BS may have a shape complementary to a concave-convex portion of a diffractive structure DF on a surface facing the first refractive layer RL1, and may be formed to have a constant thickness between the first refractive layer RL1 and the optical structure OP_1.

The base layer BS may include an electro-optical material whose refractive index changes in case that a voltage is applied. The electro-optical material may be a liquid crystal including a material having birefringence having the ordinary ray refractive index $n_o$ and the extraordinary ray refractive index $n_e$. The liquid crystal may have the extraordinary ray refractive index $n_e$ in case that the voltage is applied, and may have the ordinary ray refractive index $n_o$ in case that the voltage is not applied.

The optical structure OP_1 may be disposed on the base layer BS. The optical structure OP_1 may change an optical path by refracting incident light incident on a second interface LL2 facing a second refractive layer RL2. As shown in FIG. 6A, the optical structure OP_1 may have a prism structure. The cross-sectional shape of the optical structure OP_1 may have a substantially triangular shape. However, the disclosure is not limited thereto. For example, as shown in FIG. 6B, the optical structure OP_1 may have a lens structure. The cross-sectional shape of the optical structure OP_1 may have a substantially semicircular shape.

The optical structure OP_1 may be made of a photocurable isotropic polymer having a third refractive index $n_p$. For example, the isotropic polymer may be any one of acrylic resin, polycarbonate, and cycloolefin polymer (COP).

According to an embodiment, the third refractive index $n_p$ may have a size different from the first refractive index $n_{inc}$ and the second refractive index $n_{exit}$. The first refractive index $n_{inc}$ and the second refractive index $n_{exit}$ may have the same size as the ordinary ray refractive index $n_o$, and the third refractive index $n_p$ may have a size different from each of the ordinary ray refractive index $n_o$ and the extraordinary ray refractive index $n_e$. For example, the third refractive index $n_p$ may be greater than the first refractive index $n_{inc}$, the second refractive index $n_{exit}$, and the ordinary ray refractive index $n_o$, and may be smaller than the extraordinary ray refractive index $n_e$.

In contrast to an embodiment shown in FIGS. 6A and 6B, in an embodiment shown in FIG. 8, in case that a voltage is applied to a viewing angle modulator VAM_1 (or the refractive index conversion layer VRL_1), the display device may be operated in the normal mode in which the viewing angle of the display panel DP is set to the reference viewing angle. In case that the voltage is not applied to the viewing angle modulator VAM_1 (or the refractive index conversion layer VRL_1), the display device may be operated in the private mode in which the viewing angle of the display panel DP is set to be narrower than the reference viewing angle.

For example, in case that the voltage is applied to the viewing angle modulator VAM_1 (or the refractive index conversion layer VRL_1), the refractive index of the base layer BS of the refractive index conversion layer VRL_1 may be changed to the extraordinary ray refractive index $n_e$ due to the liquid crystal. The light emitted from the display panel DP may be diffracted at the first interface LL1 between the first refractive layer RL1 and the base layer BS, and may be reflected at a third interface LL3 between the base layer BS and the optical structure OP_1 and the second interface LL2 between the optical structure OP_1 and the second refractive layer RL2. Accordingly, Equation 1 (or diffraction formula) described above may be used in the first interface LL1 and Equation 2 (or the refraction formula) described above may be used in the second interface LL2 and the third interface LL3 to derive the third refractive index $n_p$ that allows the light emitted from the display panel DP to go straight.

In case that the voltage is not applied to the viewing angle modulator VAM_1 (or the refractive index conversion layer VRL_1), the refractive index of the base layer BS of the refractive index conversion layer VRL_1 may be changed to the ordinary ray refractive index $n_o$ due to the liquid crystal. The light emitted from the display panel DP may not be diffracted at the first interface LL1 between the first refractive layer RL1 and the base layer BS, and may be refracted at the third interface LL3 between the base layer BS and the optical structure OP_1 and the second interface LL2 between the optical structure OP_1 and the second refractive layer RL2. Accordingly, Equation 2 (or refraction formula) described above may be used in the second interface LL2 and the third interface LL3 to derive the third refractive index $n_p$ that allows the light emitted from the display panel DP has a viewing angle narrower than the reference viewing angle θref.

Figure 9A:
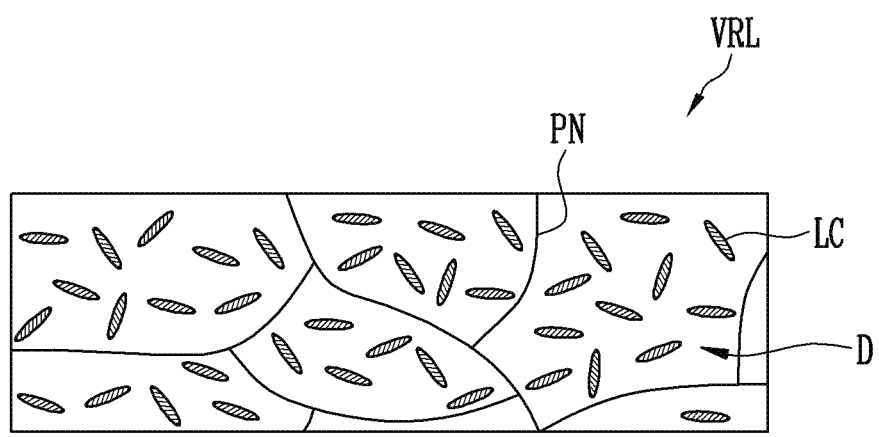
FIGS. 9A and 9B are diagrams in a case that an optical material included in a refractive index conversion layer is PNLC.
Figure 9B:
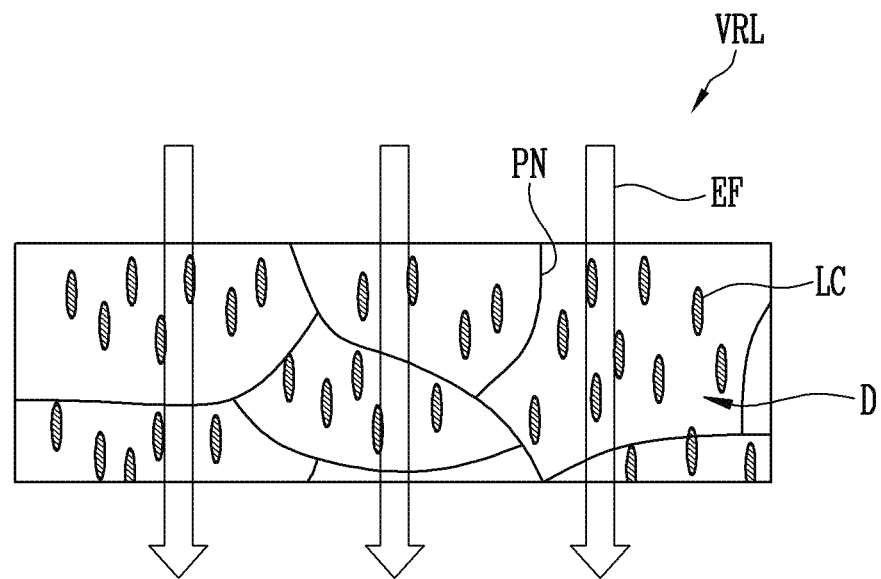
Figure 10:
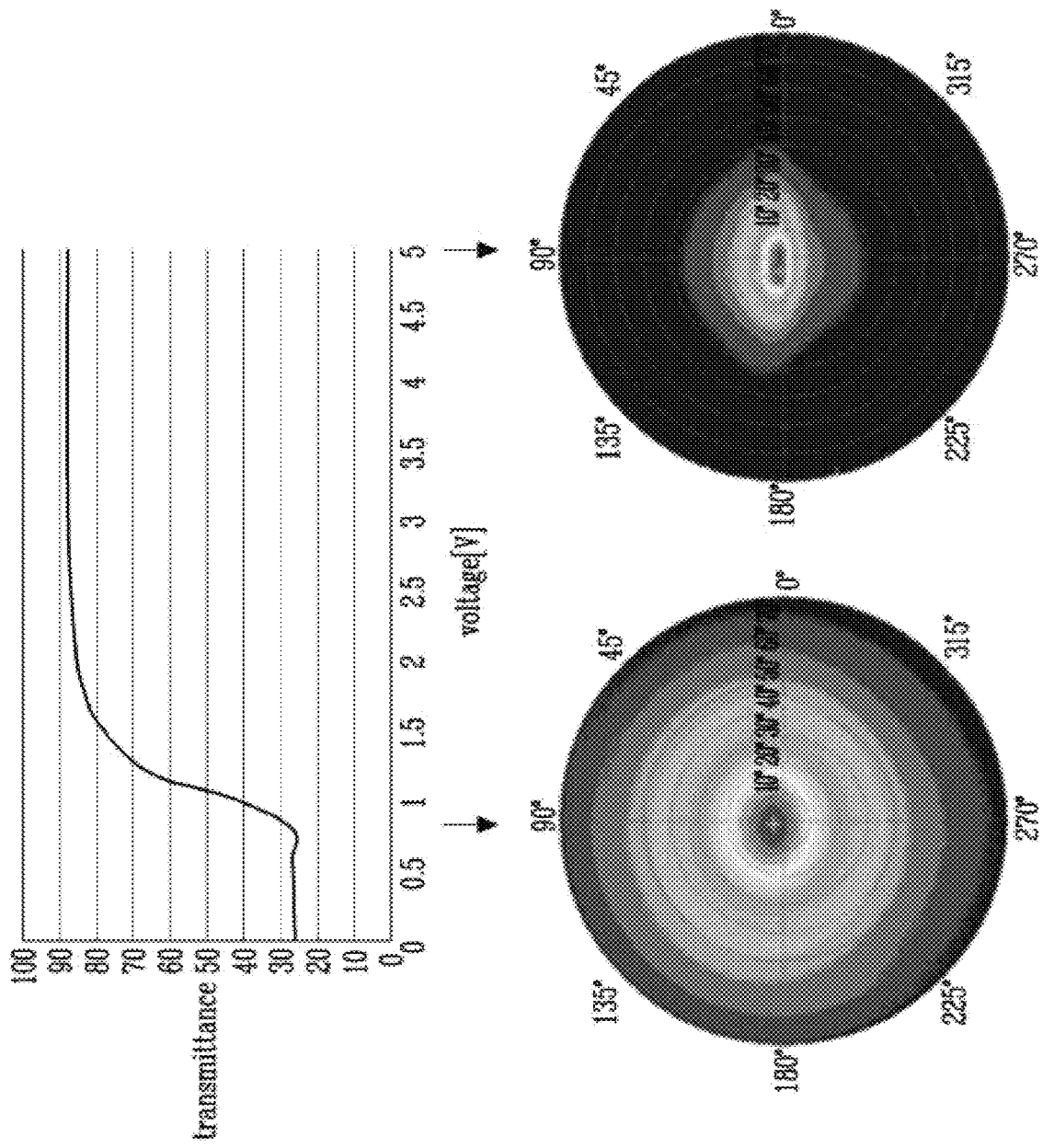
FIG. 10 is a graph for explaining a change in transmittance according to a voltage applied to the PNLC.
Figure 11:
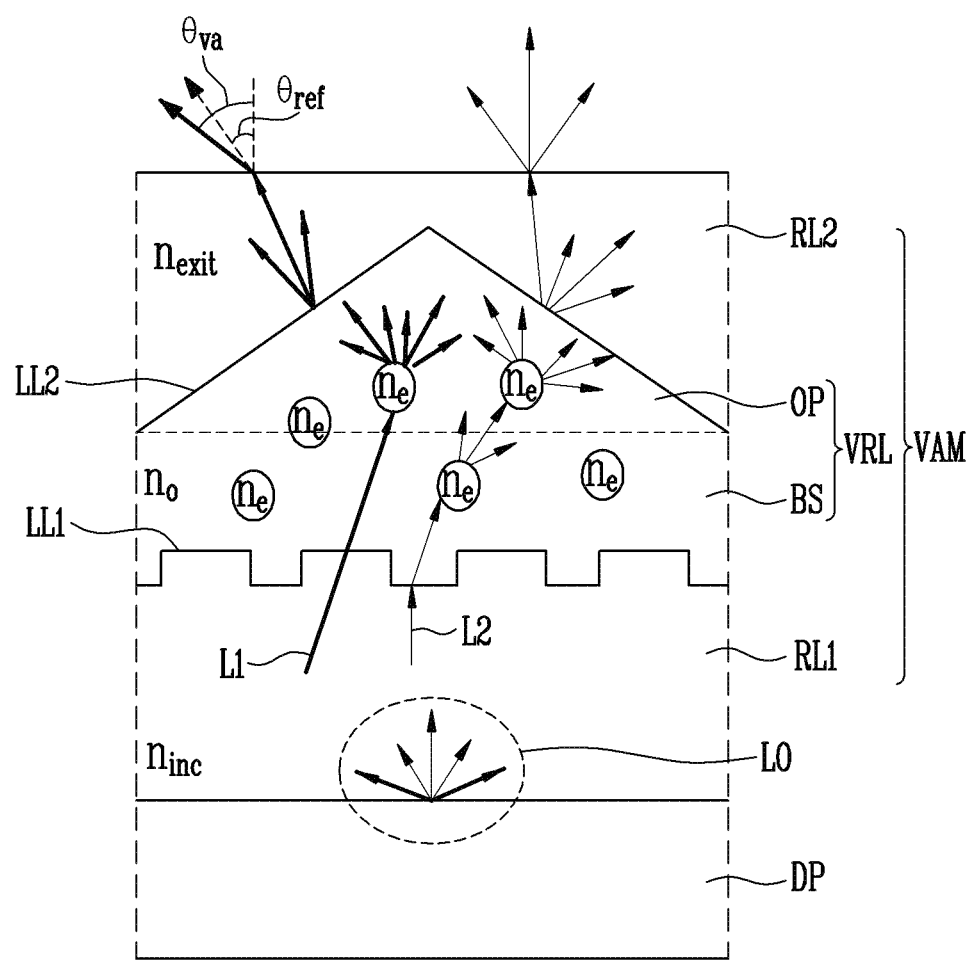
FIG. 11 is a diagram for explaining the normal mode of the display device in case that the optical material included in the refractive index conversion layer is PNLC.

FIGS. 9A and 9B are diagrams for explaining a case where an optical material included in a refractive index conversion layer is PNLC. FIG. 10 is a graph for explaining a change in transmittance according to a voltage applied to the PNLC. FIG. 11 is a diagram for explaining the normal mode of the display device in case that the optical material included in the refractive index conversion layer is PNLC.

Compared with embodiments shown in FIGS. 6A to 7B in which the optical material included in the refractive index conversion layer is the liquid crystal, an embodiment shown in FIGS. 9A to 11 may differ in that the optical material included in the refractive index conversion layer is Polymer Network Liquid Crystal (PNLC).

Referring to FIGS. 9A and 9B, the optical material included in the refractive index conversion layer VRL may be made of PNLC including a polymer network PN and a liquid crystal material LC stabilized by the polymer network PN. The polymer network PN may be formed in a three-dimensional structure, and domains D may be formed by the polymer network PN. A domain D may refer to a space formed by a net-shaped structure of the polymer network PN, and may refer to a liquid crystal area. The liquid crystal material LC may be dispersed in the domains D formed by the polymer network PN. Polymer networks PN may be distributed in random shapes.

The polymer network PN may be composed of a cross-linking reaction product or a polymerization reaction product of a compound consisting of (meth)acrylates, poly(meth)acrylate, fluorinated acrylate, or a combination thereof. However, the material constituting the polymer network PN is not limited to the above examples.

The liquid crystal material LC may be made of a compound that may be phase separated in the polymer network PN and may exist in an oriented state within the polymer network PN. For example, the liquid crystal material LC may be made of a nematic liquid crystal, a cholesteric liquid crystal, a smectic liquid crystal, a ferroelectric liquid crystal, or a combination thereof, but is not limited thereto.

The liquid crystal material LC may be phase separated and may not be combined with the polymer network PN, and the orientation thereof may be changed as a voltage is applied from outside. To this end, the liquid crystal material LC may be a compound that does not have a polymerizable group or a crosslinkable group.

Referring to FIGS. 9A and 10, in case that the voltage is not applied to the refractive index conversion layer VRL, liquid crystal molecules constituting the liquid crystal material LC may not be arranged or disposed in a specific or given direction, but may be distributed in a random direction to scatter light. The liquid crystal material LC included in a first domain among the domains D may have the ordinary ray refractive index $n_o$, and the liquid crystal material LC included in a second domain may have the extraordinary ray refractive index $n_e$. For example, light passing through the first domain may go straight, and light passing through the second domain may be scattered.

Conversely, referring to FIGS. 9B and 10, in case that the voltage is applied to the refractive index conversion layer VRL, the liquid crystal molecules constituting the liquid crystal material LC may be aligned in parallel with an electric field EF, so that the refractive index conversion layer VRL may become transparent. All of the liquid crystal materials LC included in the domains D may have the extraordinary ray refractive index $n_e$.

Similar to the case where the optical material is the liquid crystal, even in case that the optical material included in the refractive index conversion layer VRL is PNLC, in case that the voltage is applied to the viewing angle modulator VAM, the display device 1 may be operated in the private mode in which the viewing angle of the display panel DP is set to be narrower than the reference viewing angle, and in case that the voltage is not applied to the viewing angle modulator VAM, the display device 1 may be operated in the normal mode in which the viewing angle of the display panel DP is set to the reference viewing angle.

As described above, in case that the voltage is applied to the refractive index conversion layer VRL, the liquid crystal material LC may have only the extraordinary ray refractive index $n_e$. Therefore, since the same conditions as those of an embodiment shown in FIG. 7B are satisfied, duplicate descriptions of the private mode will be omitted.

Referring to FIG. 11, unlike an embodiment shown in FIG. 7A, in case that the voltage is not applied to the refractive index conversion layer VRL in the normal mode, the liquid crystal material LC included in the first domain among the domains D may have the ordinary ray refractive index $n_o$, and the liquid crystal material LC included in the second domain may have the extraordinary ray refractive index $n_e$. Accordingly, in the refractive index conversion layer VRL, the first exit light L1 and the second exit light L2 may go straight in case that passing through a first domain area having the ordinary ray refractive index $n_o$ and may be scattered in case that passing through a second domain area having the extraordinary ray refractive index $n_e$. The first refractive index $n_{inc}$, the second refractive index $n_{exit}$, and the ordinary ray refractive index $n_o$ may have the same size, and the extraordinary ray refractive index $n_e$ may be greater than the first refractive index $n_{inc}$, the second refractive index $n_{exit}$, and the ordinary ray refractive index $n_o$.

For this reason, the display device may be operated in the normal mode in which the range of the exit angle $\theta va$ of the light L0 emitted from the display panel DP with respect to one surface or a surface of the second refractive layer RL2 facing the window member WM is set to be wider than the range of the reference viewing angle $\theta ref$.

The display device according to embodiments may be controlled to have the narrow viewing angle or the reference viewing angle according to a user's situation, by way of non-limiting example.

The effects according to embodiments are not limited by the contents described above, and more various effects are included in the specification.

Embodiments have been described above with reference to the drawings. However, those skilled in the art to which the disclosure pertains will understand that the disclosure can be implemented in other forms without changing the technical spirit or essential features of the disclosure. Therefore, it should be understood that embodiments described above are illustrative in all respects and not restrictive.

What is claimed is:

1. A display device comprising:
    a display panel including a display surface having a Lambertian light emission distribution; and
    a viewing angle modulator disposed on the display panel, wherein
    the viewing angle modulator includes:
        a first refractive layer including a diffraction structure on a surface;
        a refractive index conversion layer disposed on the first refractive layer and including an electro-optical material having a refractive index that changes when a voltage is applied to the electro-optical material; and
        a second refractive layer disposed on the refractive index conversion layer, and the refractive index conversion layer includes:
        a base layer; and
        an optical structure disposed on the base layer that changes a path of light incident on a surface facing the second refractive layer.

2. The display device of claim 1, wherein the optical structure is one of a prism structure and a convex lens structure.

3. The display device of claim 1, wherein the viewing angle modulator includes:
    a normal mode that sets a viewing angle of the display panel to a reference viewing angle when the voltage is not applied to the electro-optical material of the refractive index conversion layer; and
    a private mode that sets the viewing angle of the display panel to be narrower than the reference viewing angle when the voltage is applied to the electro-optical material of the refractive index conversion layer.

4. The display device of claim 3, wherein the refractive index conversion layer divides incident light incident on a first interface between the first refractive layer and the refractive index conversion layer into first exit light traveling in a first path and second exit light traveling in a second path, through the diffraction structure when the voltage is applied to the electro-optical material of the refractive index conversion layer.

5. The display device of claim 4, wherein
    the first exit light is incident on a second interface between the optical structure and the second refractive layer in a first incident angle range, and
    the second exit light is incident on the second interface in a second incident angle range having an angle smaller than an angle of the first incident angle range.

6. The display device of claim 5, wherein
the first exit light does not pass through the display surface of the display panel,
the second exit light passes through the display surface of the display panel, and
an exit angle of the second exit light is smaller than an exit angle range of the reference viewing angle.

7. The display device of claim 1, wherein
the first refractive layer has a first refractive index,
the second refractive layer has a second refractive index, and
the first refractive index and the second refractive index are same.

8. The display device of claim 7, wherein the electro-optical material is a liquid crystal including a material having a birefringence having an ordinary ray refractive index and an extraordinary ray refractive index.

9. The display device of claim 8, wherein the liquid crystal has the extraordinary ray refractive index when the voltage is applied to the electro-optical material of the refractive index conversion layer and has the ordinary ray refractive index when the voltage is not applied to the electro-optical material of the refractive index conversion layer.

10. The display device of claim 8, wherein the first refractive index, the second refractive index, and the ordinary refractive index are same.

11. The display device of claim 7, wherein
the refractive index conversion layer includes the electro-optical material only in the base layer, and
the optical structure has a third refractive index.

12. The display device of claim 11, wherein the electro-optical material is a liquid crystal including a material having a birefringence having an ordinary ray refractive index and an extraordinary ray refractive index.

13. The display device of claim 12, wherein the liquid crystal has the extraordinary ray refractive index when the voltage is applied to the electro-optical material of the refractive index conversion layer and has the ordinary ray refractive index when the voltage is not applied to the electro-optical material of the refractive index conversion layer.

14. The display device of claim 12, wherein
the first refractive index, the second refractive index, and the ordinary refractive index are same, and
the third refractive index is greater than the first refractive index and the second refractive index and smaller than the ordinary ray refractive index.

15. The display device of claim 7, wherein the electro-optical material is a Polymer Network Liquid Crystal (PNLC) including a liquid crystal stabilized by a polymer network having a three-dimensional net structure from an outer surface to an inside of the electro-optical material.

16. The display device of claim 15, wherein the liquid crystal includes a material having a birefringence having an ordinary ray refractive index and an extraordinary ray refractive index.

17. The display device of claim 16, wherein the PNLC is divided into domains including the liquid crystal by the polymer network.

18. The display device of claim 17, wherein
the domains have the extraordinary ray refractive index when the voltage is applied to the PNLC, and
a first domain of the domains has the ordinary ray refractive index and a second domain of the domains has the extraordinary ray refractive index when the voltage is not applied to the PNLC.

19. The display device of claim 18, wherein the second domain scatters incident light.

20. The display device of claim 16, wherein the first refractive index, the second refractive index, and the ordinary ray refractive index are same.

* * * * *